(12) United States Patent
Kim et al.

(10) Patent No.: US 12,365,833 B2
(45) Date of Patent: Jul. 22, 2025

(54) CURABLE COMPOSITION, CURED FILM PRODUCED USING SAME, AND COLOR FILTER COMPRISING SAME

(71) Applicant: SAMSUNG SDI CO., LTD., Yongin-si (KR)

(72) Inventors: Jonggi Kim, Suwon-si (KR); Yonghee Kang, Suwon-si (KR); Onyou Park, Suwon-si (KR); Bumjin Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 117 days.

(21) Appl. No.: 18/011,485

(22) PCT Filed: Aug. 20, 2021

(86) PCT No.: PCT/KR2021/011109
§ 371 (c)(1),
(2) Date: Jun. 14, 2023

(87) PCT Pub. No.: WO2022/059942
PCT Pub. Date: Mar. 24, 2022

(65) Prior Publication Data
US 2023/0357631 A1 Nov. 9, 2023

(30) Foreign Application Priority Data
Sep. 16, 2020 (KR) .......... 10-2020-0119173

(51) Int. Cl.
| | | |
|---|---|---|
| C09D 11/30 | (2014.01) | |
| C08F 222/10 | (2006.01) | |
| C09D 11/107 | (2014.01) | |
| C09D 11/32 | (2014.01) | |
| C09K 11/06 | (2006.01) | |
| C09K 11/56 | (2006.01) | |
| C09K 11/70 | (2006.01) | |
| C09K 11/88 | (2006.01) | |

(52) U.S. Cl.
CPC .......... C09K 11/06 (2013.01); C08F 222/102 (2020.02); C09D 11/107 (2013.01); C09D 11/32 (2013.01); C09K 11/565 (2013.01); C09K 11/70 (2013.01); C09K 11/883 (2013.01)

(58) Field of Classification Search
CPC ....... C09K 11/06; C09K 11/565; C09K 11/70; C09K 11/883; C08F 222/102; C09D 11/107; C09D 11/32
See application file for complete search history.

(56) References Cited

U.S. PATENT DOCUMENTS

| | | | | |
|---|---|---|---|---|
| 2013/0305946 A1* | 11/2013 | Iftime | .................... | C09D 11/50 |
| | | | | 101/483 |
| 2018/0016454 A1* | 1/2018 | Matsushita | .......... | C09D 11/104 |
| 2018/0102449 A1 | 4/2018 | Pschenitzka et al. | | |
| 2019/0041747 A1 | 2/2019 | Youn et al. | | |
| 2019/0129302 A1* | 5/2019 | Youn | ........................ | G03F 7/105 |
| 2020/0157420 A1 | 5/2020 | Hong et al. | | |
| 2020/0231871 A1 | 7/2020 | Kim et al. | | |
| 2020/0248068 A1 | 8/2020 | Choi et al. | | |
| 2024/0084194 A1 | 3/2024 | Choi et al. | | |

FOREIGN PATENT DOCUMENTS

| | | |
|---|---|---|
| CN | 109073972 A | 12/2018 |
| CN | 110387163 A | 10/2019 |
| CN | 111164128 A | 5/2020 |
| JP | 2016-66041 A | 4/2016 |
| JP | 2019-532473 A | 11/2019 |
| JP | 2020-015894 A | 1/2020 |
| JP | 2020-118971 A | 8/2020 |
| JP | 2020-126234 A | 8/2020 |
| KR | 10-2015-0039987 A | 4/2015 |
| KR | 10-2015-0126959 A | 11/2015 |
| KR | 10-2016-0069401 A | 6/2016 |
| KR | 10-2016-0103792 A | 9/2016 |
| KR | 10-2018-0128195 A | 12/2018 |
| KR | 10-2019-0007069 A | 1/2019 |
| KR | 10-1937665 B1 | 1/2019 |
| KR | 10-2019-0108366 A | 9/2019 |
| KR | 10-2028969 B1 | 10/2019 |
| KR | 10-2020-0052507 A | 5/2020 |
| KR | 10-2020-0090033 A | 7/2020 |
| KR | 10-2020-0090493 A | 7/2020 |

(Continued)

OTHER PUBLICATIONS

Chinese Office Action and Search Report, for Patent Application No. 202180057241.8, dated Jan. 15, 2024, 7 pages.
Japanese Office Action for Application No. 2023-513973, dated Mar. 26, 2024, 5 pages.
Lin, Nan, et al., "Effect of using ink containing polyacrylate and silicone surfactant on the inkjet printing of quantum dot films," Journal of Information Display, Dec. 2019, Taylor & Francis Group, 10 pages.
Zhang, Wang-xi, et al., "Synthesis and characterization of PMMA/CdSe nanocomposites parpared by in situ bulk polymerization," J. Wuhan Institute Technology, Jun. 2012, vol. 34, No. 6., Chine Academic Journal Electronic Publishing House, 3 pages.

(Continued)

*Primary Examiner* — Haidung D Nguyen
(74) *Attorney, Agent, or Firm* — Womble Bond Dickinson (US) LLP

(57) ABSTRACT

Disclosed are a curable composition, a cured layer manufactured using the curable composition, and a color filter including the cured layer. The curable composition includes a quantum dot and a polymerizable compound, wherein the polymerizable compound includes a first polymerizable compound serving as a hydrogen bond donor and a second polymerizable compound serving as a hydrogen bond acceptor, and the first polymerizable compound and second polymerizable compound each independently include a (meth)acrylate group at at least one terminal end.

15 Claims, 4 Drawing Sheets

(56) References Cited

FOREIGN PATENT DOCUMENTS

| KR | 10-2020-0095988 A | 8/2020 |
| KR | 10-2020-0105052 A | 9/2020 |
| KR | 10-2021-0023019 A | 3/2021 |
| WO | WO 2018-004015 A1 | 1/2018 |

OTHER PUBLICATIONS

Zhu, Zhijie, et al., "Construction of Hydrogen-Bond-Assisted Crack-Free Photonic Crystal Films and Their Performance on Fluorescence Enhancement Effect," Macromolecular Materials and Engineering, 2017, 8 pages.

International Search Report for corresponding Application No. PCT/KR2021/011109 dated Dec. 6, 2021, 4pp.

Notice of Allowance issued on Sep. 24, 2024 by the Japanese Patent Office for corresponding Japanese Patent Application No. 2023-513973, 3 pages.

Notice of Allowance issued Nov. 7, 2024 by the Korean Patent Office for corresponding Korean Patent Application No. 10-2020-0119173, 2 pages.

\* cited by examiner

CURABLE COMPOSITION, CURED FILM PRODUCED USING SAME, AND COLOR FILTER COMPRISING SAME

CROSS-REFERENCE TO RELATED APPLICATIONS

This application is a U.S. National Phase Patent Application of International Application Number PCT/KR2021/011109, filed on Aug. 20, 2021, which claims priority to Korean Patent Application Number 10-2020-0119173, filed on Sep. 16, 2020, the entire content of each of which is incorporated herein by reference.

BACKGROUND OF THE INVENTION

(a) Field of the Invention

This disclosure relates to a curable composition, a cured layer using the composition, and a color filter and a display device including the cured layer.

(b) Description of the Related Art

In the case of general quantum dots, due to surface characteristics having hydrophobicity, a solvent in which it is dispersed is limited, and thus, it is difficult to introduce into a polar system such as a binder or a curable monomer.

For example, even in the case of a quantum dot ink composition being actively researched, a polarity is relatively low in an initial step and it may be dispersed in a solvent used in a curable composition having a high hydrophobicity. Therefore, because 20 wt % or more of quantum dots are difficult to be included based on the total amount of the composition, it is impossible to increase photoefficiency of the ink over a certain level. Even though the quantum dots are additionally added and dispersed in order to increase photoefficiency, a viscosity exceeds a range capable of ink-jetting and thus processability may not be satisfied.

In order to achieve the viscosity range capable of ink-jetting, a method of lowering an ink solid content by dissolving 50 wt % or more of a solvent based on the total amount of the composition, which also provides a somewhat satisfactory result in terms of viscosity. However, it may be considered to be a satisfactory result in terms of a viscosity, but nozzle drying due to solvent volatilization, nozzle clogging, and reduction of a single film thickness as time passed after jetting may become worse and it is difficult to control a thickness deviation after curing. Thus, it is difficult to apply it to actual processes.

Therefore, a quantum dot ink that does not include a solvent is the most desirable form to be applied to an actual process. The current technique of applying a quantum dot itself to a solvent type composition is now limited to a certain extent.

In the case of a solvent-free curable composition (quantum dot ink composition), since an excessive amount of polymerizable compound is included, clogging and ejection failure by nozzle drying due to volatility, and single film thickness reduction due to volatilization of the ink composition jetted in the patterned partition wall pixel may be caused. Therefore, it is desirable to lower the vapor pressure of the polymerizable compound, which is a main component constituting the solvent-free curable composition, as much as possible. Accordingly, efforts have been made to increase the molecular weight of the polymerizable monomer or to lower the vapor pressure of the polymerizable compound by introducing a chemical structure including an ethylene glycol chain or a hydroxyl group. However, as the vapor pressure of the polymerizable compound is lower, the viscosity of the polymerizable compound increases accordingly, thereby increasing the viscosity of the curable composition including the same, resulting in poor ink-jetting properties.

Accordingly, research to simultaneously impart low vapor pressure and low viscosity to the polymerizable compound, which is a major component constituting the quantum dot-containing solvent-free curable composition, has been made.

SUMMARY OF THE INVENTION

An embodiment provides a curable composition using two different polymerizable compounds capable of hydrogen bonding together to cause hydrogen bonding interaction, thereby enhancing ink-jetting properties and minimizing single film thickness reduction through improved volatility.

Another embodiment provides a cured layer manufactured using the curable composition.

Another embodiment provides a color filter and a display device including the cured layer.

An embodiment provides a curable composition including a quantum dot and a polymerizable compound, wherein the polymerizable compound includes a first polymerizable compound serving as a hydrogen bond donor and a second polymerizable compound serving as a hydrogen bond acceptor, and the first polymerizable compound and the second polymerizable compound each independently include a (meth)acrylate group at at least one terminal end.

The first polymerizable compound may be represented by Chemical Formula 1.

[Chemical Formula 1]

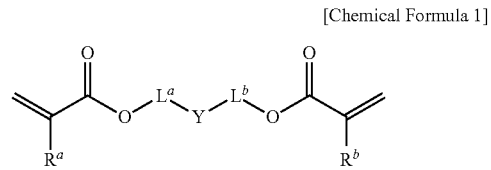

In Chemical Formula 1, $R^a$ and $R^b$ are each independently a hydrogen atom or a substituted or unsubstituted C1 to C10 alkyl group, $L^a$ and $L^b$ are each independently a single bond, a substituted or unsubstituted C1 to C20 alkylene group, or a substituted or unsubstituted C6 to C20 arylene group, and X is a C1 to C10 alkylene group substituted with a hydroxyl group, a C1 to C10 alkylene group substituted with an amino group, or *—NH—*.

The first polymerizable compound may have a viscosity greater than 6.2 cps and a vapor pressure less than $1 \times 10^{-3}$ torr.

The first polymerizable compound may be represented by any one of Chemical Formula 1-1 to Chemical Formula 1-3.

[Chemical Formula 1-1]

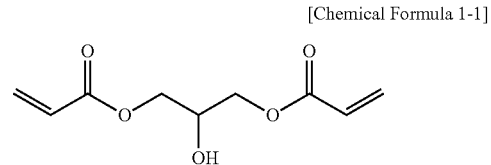

-continued

[Chemical Formula 1-2]

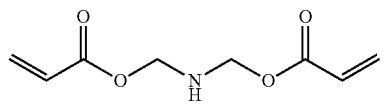

[Chemical Formula 1-3]

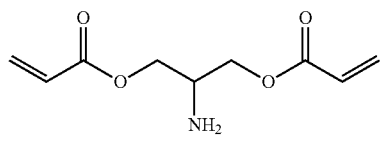

The second polymerizable compound may be represented by Chemical Formula 2.

[Chemical Formula 2]

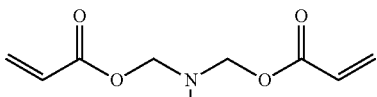

In Chemical Formula 2, $R^c$ and $R^d$ are each independently a hydrogen atom or a substituted or unsubstituted C1 to C10 alkyl group, $L^c$ and $L^d$ are each independently a single bond, a substituted or unsubstituted C1 to C20 alkylene group, or a substituted or unsubstituted C6 to C20 arylene group, and Y is an oxygen atom, a sulfur atom, *—C(=O)—*, a C1 to C10 alkylene group substituted with a fluorine atom or *—$NR^e$ ($R^e$ is a C1 to C10 alkyl group or a C6 to C20 aryl group)-*.

The second polymerizable compound may have a viscosity of less than or equal to 6.2 cps and a vapor pressure of greater than or equal to $1 \times 10^{-3}$ torr.

The second polymerizable compound may be represented by one of Chemical Formula 2-1 to Chemical Formula 2-5.

[Chemical Formula 2-1]

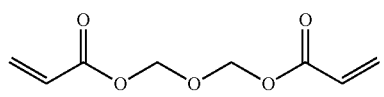

[Chemical Formula 2-2]

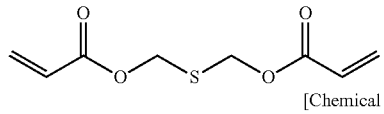

[Chemical Formula 2-3]

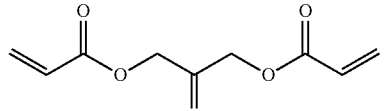

[Chemical Formula 2-4]

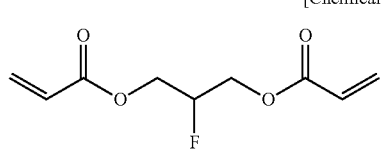

[Chemical Formula 2-5]

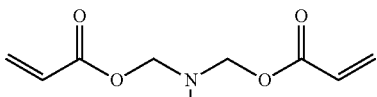

The curable composition may further include a light diffusing agent, a polymerization initiator, a binder resin, or a combination thereof.

The light diffusing agent may include barium sulfate, calcium carbonate, titanium dioxide, zirconia, or a combination thereof.

The curable composition may be a solvent-free curable composition.

The solvent-free curable composition may include 5 wt % to 60 wt % of the quantum dots; and 40 wt % to 95 wt % of the polymerizable compound based on the total amount of the solvent-free curable composition.

The curable composition may further include a solvent. Herein, the curable composition may include 1 wt % to 40 wt % of the quantum dots; 1 wt % to 20 wt % of the polymerizable compound; and 40 wt % to 80 wt % of the solvent based on the total amount of the curable composition.

The curable composition may further include a polymerization inhibitor; malonic acid; 3-amino-1,2-propanediol; a silane-based coupling agent; a leveling agent; a fluorine-based surfactant; or a combination thereof.

Another embodiment provides a cured layer manufactured using the curable composition.

Another embodiment provides a color filter and a display device including the cured layer.

Another embodiment provides a display device including the color filter.

Other embodiments of the present invention are included in the following detailed description.

Two different monomers with high and low viscosities that serve as a hydrogen bond donor and hydrogen bond acceptor are mixed to cause a hydrogen bonding interaction, thereby strengthening the ink-jetting properties of the ink composition, and at the same time improving the volatility problem that the ink composition easily volatilizes over time, and thus it is possible to minimize the reduction rate of the single film thickness of the coated ink composition.

DETAILED DESCRIPTION OF THE EMBODIMENTS

Figure 1:
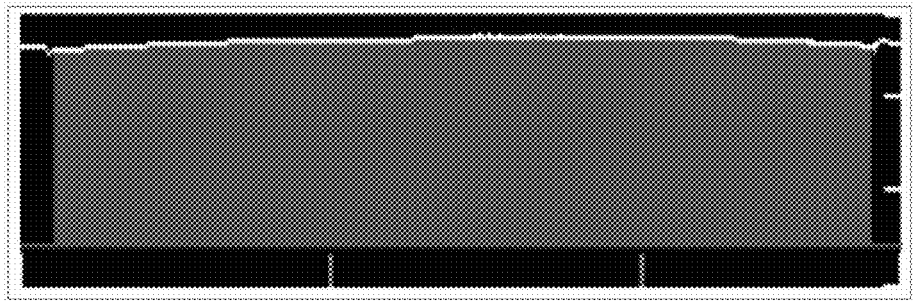
FIG. 1 is a cross-sectional photograph of a film after 1 hour has elapsed after ink-jetting a pixel with a curable composition according to Example 1.

Hereinafter, embodiments of the present invention are described in detail. However, these embodiments are exemplary, the present invention is not limited thereto and the present invention is defined by the scope of claims.

As used herein, when specific definition is not otherwise provided, "alkyl group" refers to a C1 to C20 alkyl group, "alkenyl group" refers to a C2 to C20 alkenyl group, "cycloalkenyl group" refers to a C3 to C20 cycloalkenyl group, "heterocycloalkenyl group" refers to a C3 to C20 heterocycloalkenyl group, "aryl group" refers to a C6 to C20 aryl group, "arylalkyl group" refers to a C6 to C20 arylalkyl group, "alkylene group" refers to a C1 to C20 alkylene group, "arylene group" refers to a C6 to C20 arylene group, "alkylarylene group" refers to a C6 to C20 alkylarylene group, "heteroarylene group" refers to a C3 to C20 heteroarylene group, and "alkoxylene group" refers to a C1 to C20 alkoxylene group.

As used herein, when specific definition is not otherwise provided, "substituted" refers to replacement of at least one hydrogen atom by a substituent selected from a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, "hetero" refers to inclusion of at least one heteroatom of N, O, S, and P, in the chemical formula.

As used herein, when specific definition is not otherwise provided, "(meth)acrylate" refers to both "acrylate" and "methacrylate", and "(meth)acrylic acid" refers to "acrylic acid" and "methacrylic acid."

As used herein, when specific definition is not otherwise provided, the term "combination" refers to mixing or copolymerization.

In the present specification, when a definition is not otherwise provided, hydrogen is bonded at the position when a chemical bond is not drawn in chemical formula where supposed to be given.

In addition, in the present specification, when a definition is not otherwise provided, "*" refers to a linking point with the same or different atom or chemical formula.

Quantum dots themselves have unstable properties, and in general, when used to prepare a composition, the quantum dots are surface-modified with a ligand before use, in order to secure stability. However, according to a method of manufacturing a panel constituting a display device to date, the unstable quantum dots are used to prepare a composition, and the composition is filled to a predetermined thickness in a pixel with partition walls on a single film by using an ink-jetting equipment and exposed and thermally cured to form a cured layer and then, treated through a subsequent thermal process, manufacturing a panel. Herein, since the subsequent thermal process causes a photoefficiency loss of the quantum dots, it is most important to keep the photoefficiency constantly high even after the subsequent thermal process for manufacturing a high luminance panel.

Looking at a conventional ligand development process, in the beginning, thiol-free ligands having phosphoric acid and carboxylic acid functional groups have been mainly used. However, these ligands have excellent ligand substitution reactivity, but when a cured layer is formed by using a composition the same, photoefficiency of the cured layer may be sharply deteriorated. Accordingly, the photoefficiency deterioration problem of the cured layer is improved by introducing thiol ligands such as ethylene glycol bis(3-mercaptopropionate) and the like thereinto, but the thiol ligands have serious problems of generating outgas generation due to decomposition of the ligands at a high temperature process and also, not improving ink-jetting properties of a curable composition including quantum dots that are surface-modified by the thiol ligands. Accordingly, efforts to control ligand exchange reactivity to be low through hydroxyl ligands and the like instead of the thiol ligands and simultaneously, to prevent decomposition of the ligands even at a high temperature thermal process of a composition prepared by using surface-modified quantum dots have been made but still failed in improving photoefficiency of a cured layer.

Above all, even though the ligands for surface-modifying quantum dots are added even in an amount of 1 wt % to 2 wt % based on the total amount of a composition, a thickening phenomenon of the composition is difficult to control due to highly reactive substituents such as the thiol group or the hydroxy group, and in addition, a gelation phenomenon (increase in viscosity) of the composition within 24 hours occurs, and finally the composition itself may not be used (i.e., very undesirable in terms of ink-jetting properties).

Accordingly, efforts to modify a ligand structure itself on the quantum dot surfaces to improve heat resistance without using separate additives (e.g., apply a reactivity site or a rigid moiety to a functional group at the terminal end of a ligand) have been made, but the quantum dots with the modified ligand structure itself are very difficult to synthesize, and even if synthesized, there is no effect of improving ink-jetting properties, because a finally formulated composition still has high viscosity.

The present inventors reached a conclusion that the conventional methods of surface-modifying quantum dots are insufficient in improving ink-jetting properties and so, made a completely new approach and have developed technology of improving ink-jetting properties of an ink composition and simultaneously, volatility.

Specifically, in an embodiment, as a polymerizable compound essentially included in the quantum dot-containing curable composition, a mixture of two different polymerizable compounds including a hydrogen bond donor functional group and a hydrogen bond acceptor functional group and having high and low viscosity and vapor pressure is used, and thereby ink-jetting properties and volatility are improved.

More specifically, the curable composition according to an embodiment includes quantum dots and a polymerizable compound, wherein the polymerizable monomer includes a first polymerizable compound serving as a hydrogen bond donor and a second polymerizable compound serving as a hydrogen bond acceptor, wherein the first polymerizable compound and the second polymerizable compound each independently include a (meth)acrylate group at at least one terminal end.

Hereinafter, each component constituting the curable composition according to an embodiment is described in detail.

Polymerizable Compound

In order to improve ink-jetting properties to enable a smooth ink-jetting process, it is desirable to apply a polymerizable compound having both low vapor pressure and low viscosity. However, in the structure of a general polymerizable compound, that is, the structure of a polymerizable compound having a carbon-carbon double bond at at least one of both terminal ends, there are many restrictions as vapor pressure and viscosity are in a trade-off relationship with each other.

The present inventors have completed a curable composition capable of having excellent ink-jet processability by optimizing a combination of polymerizable compounds having different viscosities and vapor pressures.

Specifically, as a polymerizable compound, when i) a polymerizable compound (first polymerizable compound) having a higher viscosity and having a lower vapor pressure than a monomer such as 1,6-hexandiol diacrylate (viscosity of 6.2 cPs and a vapor pressure of $1\times10^{-3}$ torr) that is mainly used in general quantum dot ink curable compositions and ii) a polymerizable compound (second polymerizable compound) having a lower viscosity than that of 1,6-hexandiol diacrylate and a high vapor pressure are mixed, the two polymerizable compounds, the viscosity of the finally prepared quantum dot ink curable composition is appropriately controlled due to the hydrogen bonding between the compounds, thereby improving ink-jetting properties and volatility of the quantum dot ink curable composition.

For example, the first polymerizable compound serving as a hydrogen bond donor may be represented by Chemical Formula 1.

[Chemical Formula 1]

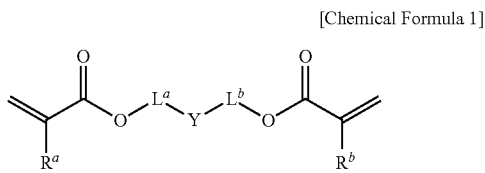

In Chemical Formula 1,
$R^a$ and $R^b$ are each independently a hydrogen atom or a substituted or unsubstituted C1 to C10 alkyl group,
$L^a$ and $L^b$ are each independently a single bond, a substituted or unsubstituted C1 to C20 alkylene group, or a substituted or unsubstituted C6 to C20 arylene group,
X is a C1 to C10 alkylene group substituted with a hydroxyl group, a C1 to C10 alkylene group substituted with an amino group, a C1 to C10 alkylene group substituted with a carboxyl group, or *—NH—*.

The hydrogen bond is a bond that occurs between two dipoles. A hydrogen atom bonded to an atom having high electronegativity plays the role of a hydrogen bond donor (δ+), and a nitrogen atom or an oxygen atom having high electronegativity is a hydrogen bond acceptor (δ−).

In X of Chemical Formula 1, since a hydrogen atom such as a hydroxy group, an amino group, a carboxyl group, or a *—NH—* group may serve as a hydrogen bond donor, the compound represented by Chemical Formula 1 may function as the first polymerizable compound of the present invention.

For example, the first polymerizable compound may have a viscosity higher than 6.2 cPs, which is a viscosity of 1,6-hexandiol diacrylate.

For example, the first polymerizable compound may have a vapor pressure lower than $1\times10^{-3}$ torr, which is the vapor pressure of 1,6-hexandiol diacrylate, for example, a vapor pressure of less than or equal to $1\times10^{-4}$ torr.

For example, the first polymerizable compound may be represented by any one of Chemical Formula 1-1 to Chemical Formula 1-3, but is not necessarily limited thereto.

[Chemical Formula 1-1]

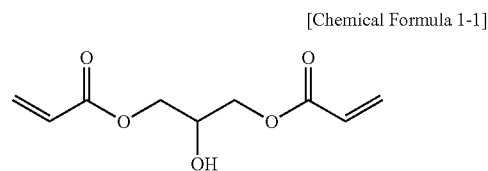

[Chemical Formula 1-2]

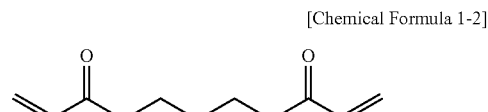

[Chemical Formula 1-3]

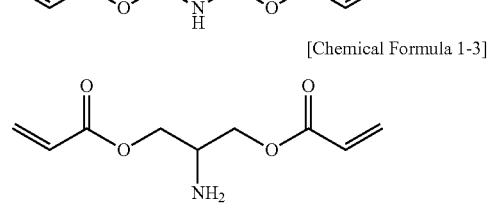

For example, the second polymerizable compound serving as a hydrogen bond acceptor may be represented by Chemical Formula 2.

[Chemical Formula 2]

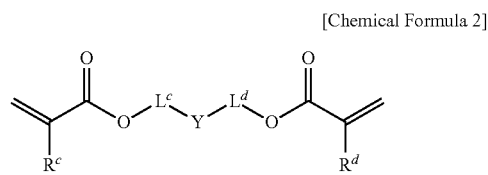

In Chemical Formula 2,
$R^c$ and $R^d$ are each independently a hydrogen atom or a substituted or unsubstituted C1 to C10 alkyl group,
$L^c$ and $L^d$ are each independently a single bond, a substituted or unsubstituted C1 to C20 alkylene group, or a substituted or unsubstituted C6 to C20 arylene group, and
Y is an oxygen atom, a sulfur atom, *—C(=O)—*, a C1 to C10 alkylene group substituted with a fluorine atom or *—$NR^e$ ($R^e$ is a C1 to C10 alkyl group or a C6 to C20 aryl group)-*.

In Y of Chemical Formula 2, an oxygen atom, a sulfur atom, a fluorine atom, and a nitrogen atom having an unshared electron pair may serve as a hydrogen bond acceptor, and thus the compound represented by Chemical Formula 2 may function as a second polymerizable compound of the present invention.

For example, the second polymerizable compound may have a viscosity of less than or equal to 6.2 cPs, which is the viscosity of 1,6-hexandiol diacrylate.

For example, the second polymerizable compound may have a vapor pressure of greater than or equal to $1\times10^{-3}$ torr, which is the vapor pressure of 1,6-hexandiol diacrylate, for example, a vapor pressure of example $1\times10^{-3}$ torr to $1\times10^{-2}$ torr.

For example, the second polymerizable compound may be represented by one of Chemical Formula 2-1 to Chemical Formula 2-5, but is not limited thereto.

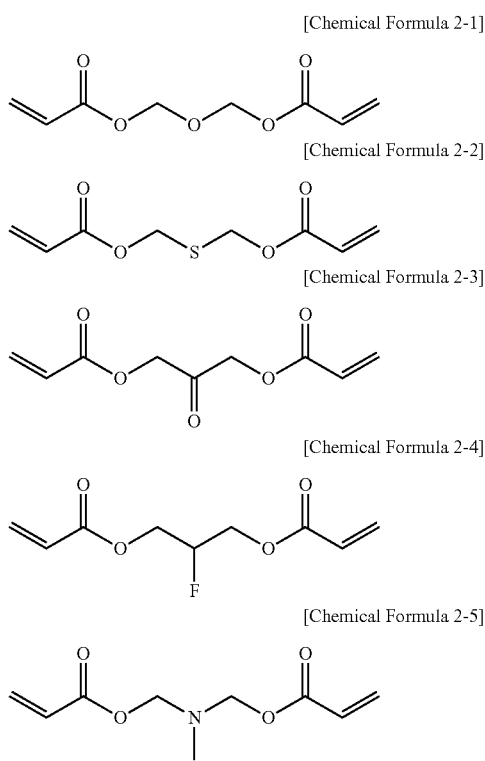

[Chemical Formula 2-1]

[Chemical Formula 2-2]

[Chemical Formula 2-3]

[Chemical Formula 2-4]

[Chemical Formula 2-5]

For example, it may be desirable to mix the first polymerizable compound and the second polymerizable compound in a weight ratio of 2:8 to 8:2.

When the curable composition according to an embodiment is a solvent-free curable composition, the polymerizable compound may be included in an amount of 40 wt % to 95 wt %, for example 40 wt % to 85 wt %, for example 40 wt % to 80 wt % based on the total weight of the solvent-free curable composition. When the content of the polymerizable compound is within the above range, a solvent-free curable composition having a viscosity capable of ink-jetting, for example, a viscosity of 10 cPs to 30 cPs may be prepared, and also the quantum dots in the prepared solvent-free curable composition may have excellent dispersibility, and thus optical properties may also be improved.

In addition, when the curable composition includes a solvent, the polymerizable compound may be included in an amount of 1 wt % to 15 wt %, for example 5 wt % to 15 wt %, based on the total amount of the curable composition. When the polymerizable compound is included within the above range, optical properties of the quantum dots may be improved.

For example, the polymerizable compound may have a molecular weight of 200 g/mol to 1,000 g/mol. When the molecular weight of the polymerizable compound is within the above range, it may be advantageous for ink-jetting because the viscosity of the composition is not increased without impairing the optical properties of the quantum dots.

In addition, the polymerizable compound may further include a monomer (third polymerizable compound) generally used in conventional thermosetting or photocurable compositions in addition to the first polymerizable compound and the second polymerizable compound. For example, the third polymerizable compound may further include an oxetane-based compound such as bis [1-ethyl(3-oxetanyl)]methyl ether.

Quantum Dots

The quantum dots in the curable composition according to an embodiment may be quantum dots that are surface-modified with a ligand having a polar group, for example, a ligand having high affinity with the polymerizable compound. In the case of the surface-modified quantum dots as described above, it is very easy to prepare a high-concentration or highly-concentrated quantum dot dispersion (improving the dispersibility of the quantum dots for the polymerizable monomer), which may have a great effect on the improvement of photoefficiency, especially for the implementation of a solvent-free curable composition.

For example, the ligand having the polar group may have a structure having high affinity with the chemical structure of the polymerizable compound.

For example, the ligand having the polar group may be represented by one of Chemical Formula 3 to Chemical Formula 16, but is not necessarily limited thereto.

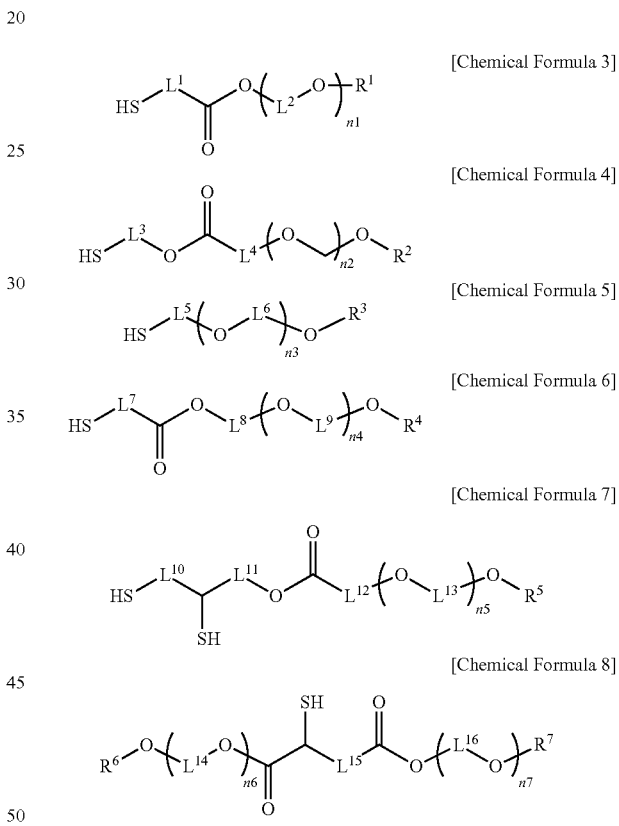

[Chemical Formula 3]

[Chemical Formula 4]

[Chemical Formula 5]

[Chemical Formula 6]

[Chemical Formula 7]

[Chemical Formula 8]

In Chemical Formula 3 to Chemical Formula 8, $R^1$ to $R^7$ are each independently a substituted or unsubstituted C1 to C10 alkyl group or a substituted or unsubstituted C6 to C20 aryl group, $L^1$ to $L^{16}$ are each independently a substituted or unsubstituted C1 to C10 alkylene group, and n1 to n7 are each independently an integer of 0 to 10.

[Chemical Formula 9]

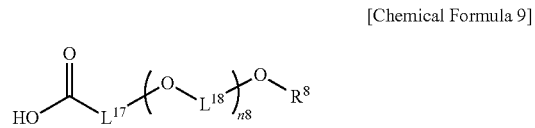

[Chemical Formula 10]

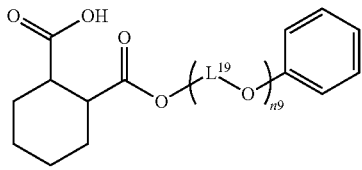

[Chemical Formula 11]

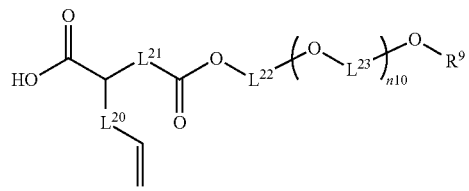

In Chemical Formula 9 to Chemical Formula 11,
$R^8$ and $R^9$ are each independently a substituted or unsubstituted C1 to C10 alkyl group,
$L^{17}$ to $L^{28}$ are each independently a substituted or unsubstituted C1 to C10 alkylene group, and
n8 to n10 are each independently an integer of 0 to 10.

[Chemical Formula 12]

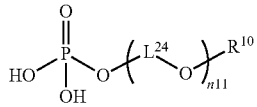

[Chemical Formula 13]

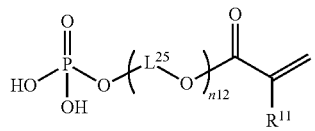

[Chemical Formula 14]

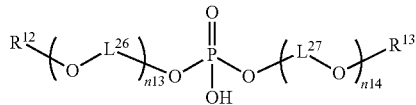

[Chemical Formula 15]

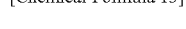

In Chemical Formula 12 to Chemical Formula 15,
$R^{10}$ to $R^{15}$ are each independently a hydrogen atom or a substituted or unsubstituted C1 to C10 alkyl group,
$L^{24}$ to $L^{29}$ are each independently a substituted or unsubstituted C1 to C10 alkylene group, and
n11 to n16 are each independently an integer of 0 to 10.

[Chemical Formula 16]

In Chemical Formula 16,
$R^{16}$ to $R^{18}$ are each independently a substituted or unsubstituted C1 to C10 alkyl group,
$L^{30}$ to $L^{32}$ are each independently a substituted or unsubstituted C1 to C10 alkylene group, and
n17 to n19 are each independently an integer of 0 to 10.

For example, the compound represented by Chemical Formula 3 to Chemical Formula 16 may be represented by one of the compounds represented by Chemical Formula A to Chemical Formula Q, but is not necessarily limited thereto.

[Chemical Formula A]

[Chemical Formula B]

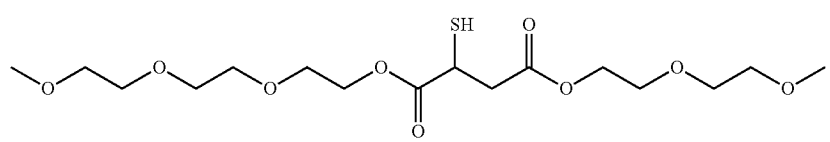

[Chemical Formula C]

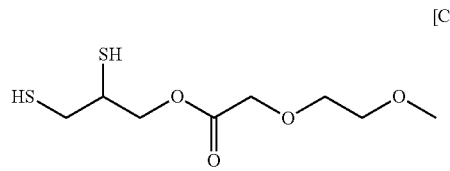

[Chemical Formula D]

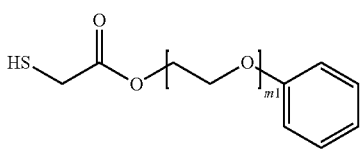

In Chemical Formula D, m1 is an integer of 0 to 10.

-continued

[Chemical Formula E]
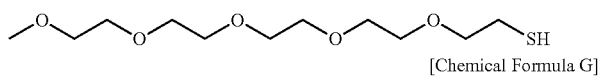

[Chemical Formula F]
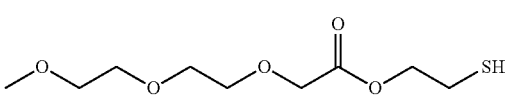

[Chemical Formula G]
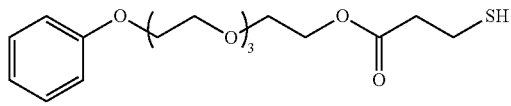

[Chemical Formula H]
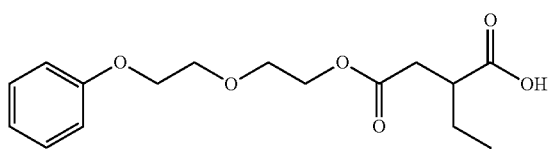

[Chemical Formula I]
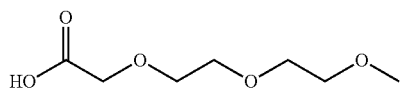

[Chemical Formula J]
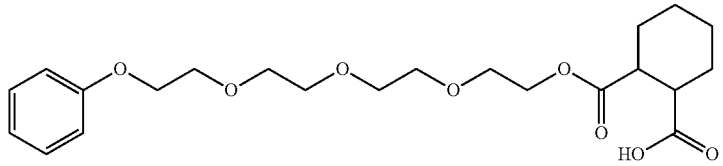

[Chemical Formula K]
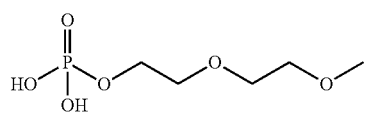

[Chemical Formula L]
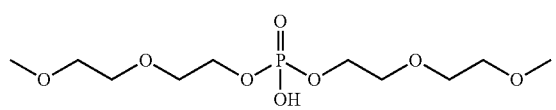

[Chemical Formula M]
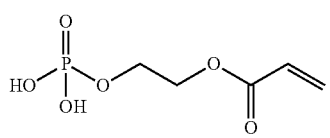

[Chemical Formula N]
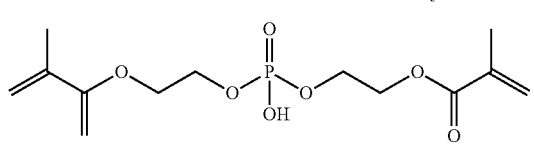

[Chemical Formula O]

[Chemical Formula P]

[Chemical Formula Q]
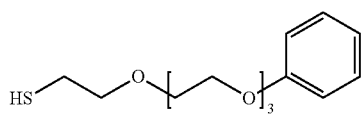

When the ligand is used, the surface modification of the quantum dots may be easier, and when the quantum dots surface-modified with the ligand are added to the above-described polymerizable compound and stirred, a very transparent dispersion may be obtained, which indicates that the surface modification of the quantum dots is performed very well.

For example, the quantum dots may have a maximum fluorescence emission wavelength in the range of 500 nm to 680 nm.

For example, when the curable composition according to an embodiment is a solvent-free curable composition, the quantum dots may be included in an amount of 5 wt % to 60 wt %, for example 10 wt % to 60 wt %, for example 20 wt % to 60 wt %, for example 30 wt % to 50 wt %. When the quantum dots are included within the above range, high light retention rate and photoefficiency may be achieved even after curing.

For example, when the curable composition according to an embodiment is a curable composition including a solvent, the quantum dots may be included in 1 wt % to 40 wt %, for example 3 wt % to 30 wt %, based on the total amount of the curable composition. When the quantum dots are included within the above range, the light conversion rate is improved and the pattern characteristics and the developing characteristics are not impaired, and thus excellent processability may be obtained.

Curable compositions (inks) containing quantum dots to date have been developed to specialize in thiol-based binders or monomers with good compatibility with quantum dots, and furthermore, they are being commercialized.

For example, the quantum dots absorb light in a wavelength region of 360 nm to 780 nm, for example 400 nm to 780 nm and emits fluorescence in a wavelength region of 500 nm to 700 nm, for example 500 nm to 580 nm, or emits fluorescence in a wavelength region of 600 nm to 680 nm. That is, the quantum dots may have a maximum fluorescence emission wavelength (fluorescence $\lambda_{em}$) at 500 nm to 680 nm.

The quantum dots may independently have a full width at half maximum (FWHM) of 20 nm to 100 nm, for example 20 nm to 50 nm. When the quantum dots have a full width at half maximum (FWHM) of the ranges, color reproducibility is increased when used as a color material in a color filter due to high color purity.

The quantum dots may independently be an organic material, an inorganic material, or a hybrid (mixture) of an organic material and an inorganic material.

The quantum dots may independently be composed of a core and a shell surrounding the core, and the core and the shell may independently have a structure of a core, a core/shell, a core/first shell/second shell, an alloy, an alloy/shell, or the like, which is composed of Group II-IV, Group III-V, and the like, but are not limited thereto.

For example, the core may include at least at least one material selected from CdS, CdSe, CdTe, ZnS, ZnSe, ZnTe, HgS, HgSe, HgTe, GaN, GaP, GaAs, InP, InAs, and an alloy thereof, but is not necessarily limited thereto. The shell surrounding the core may include at least at least one material selected from CdSe, ZnSe, ZnS, ZnTe, CdTe, PbS, TiO, SrSe, HgSe, and an alloy thereof, but is not necessarily limited thereto.

In an embodiment, since an interest in an environment has been recently much increased over the whole world, and a restriction of a toxic material also has been fortified, a cadmium-free light emitting material (InP/ZnS, InP/ZeSe/ZnS, etc.) having little low quantum efficiency (quantum yield) but being environmentally-friendly instead of a light emitting material having a cadmium-based core is used, but not necessarily limited thereto.

In the case of the quantum dots of the core/shell structure, an entire size including the shell (an average particle diameter) may be 1 nm to 15 nm, for example, 5 nm to 15 nm.

For example, the quantum dots may independently include red quantum dots, green quantum dots, or a combination thereof. The red quantum dots may independently have an average particle diameter of 10 nm to 15 nm. The green quantum dots may independently have an average particle diameter of 5 nm to 8 nm.

On the other hand, for dispersion stability of the quantum dot, the curable composition according to an embodiment may further include a dispersing agent. The dispersing agent helps uniform dispersibility of light conversion materials such as quantum dots in the curable composition and may include a non-ionic, anionic, or cationic dispersing agent. Specifically, the dispersing agent may be polyalkylene glycol or esters thereof, a polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, an alkyl amine and the like, and they may be used alone or in a mixture of two or more. The dispersing agent may be used in an amount of 0.1 wt % to 100 wt %, for example 10 wt % to 20 wt % based on a solid content of the light conversion material such as quantum dots.

Light Diffusing Agent

The curable composition according to an embodiment may further include a light diffusing agent.

For example, the light diffusing agent may include barium sulfate ($BaSO_4$), calcium carbonate ($CaCO_3$), titanium dioxide ($TiO_2$), zirconia ($ZrO_2$), or a combination thereof.

The light diffusing agent may reflect unabsorbed light in the aforementioned quantum dots and allows the quantum dots to absorb the reflected light again. That is, the light diffusing agent may increase an amount of light absorbed by the quantum dots and increase light conversion efficiency of the curable composition.

The light diffusing agent may have an average particle diameter ($D_{50}$) of 150 nm to 250 nm, and specifically 180 nm to 230 nm. When the average particle diameter of the light diffusing agent is within the ranges, it may have a better light diffusing effect and increase light conversion efficiency.

The light diffusing agent may be included in an amount of 1 wt % to 20 wt %, for example 2 wt % to 15 wt %, for example 3 wt % to 10 wt % based on the total amount of the curable composition. When the light diffusing agent is included in less than 1 wt % based on the total amount of the curable composition, it is difficult to expect an effect of improving the light conversion efficiency by using the light diffusing agent, and when it contains more than 20 wt %, the quantum dot sedimentation problem may occur.

Polymerization Initiator

The curable composition according to an embodiment may further include a polymerization initiator, for example, a photopolymerization initiator, a thermal polymerization initiator, or a combination thereof.

The photopolymerization initiator is a generally-used initiator for a photosensitive resin composition, for example an acetophenone-based compound, a benzophenone-based compound, a thioxanthone-based compound, a benzoin-based compound, a triazine-based compound, an oxime-based compound, an aminoketone-based compound, and the like, but is not necessarily limited thereto.

Examples of the acetophenone-based compound may be 2,2'-diethoxy acetophenone, 2,2'-dibutoxy acetophenone, 2-hydroxy-2-methylpropinophenone, p-t-butyltrichloroacetophenone, p-t-butyldichloroacetophenone, 4-chloroacetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

Examples of the aminoketone-based compound may be 2-benzyl-2-dimethylamino-1-(4-morpholinophenyl)-butanone-1, and the like.

The photopolymerization initiator may further include a carbazole-based compound, a diketone-based compound, a sulfonium borate-based compound, a diazo-based compound, an imidazole-based compound, a biimidazole-based compound, and the like, besides the compounds.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

Examples of the thermal polymerization initiator may be peroxide, specifically benzoyl peroxide, dibenzoyl peroxide, lauryl peroxide, dilauryl peroxide, di-tert-butyl peroxide, cyclohexane peroxide, methyl ethyl ketone peroxide, hydroperoxide (e.g., tert-butyl hydroperoxide, cumene hydroperoxide), dicyclohexyl peroxydicarbonate, 2,2-azobis(isobutyronitrile), t-butyl perbenzoate, and the like, for example 2,2'-azobis-2-methylpropinonitrile, but are not necessarily limited thereto, and any of which is well known in the art may be used.

The polymerization initiator may be included in an amount of 0.1 wt % to 5 wt %, for example 1 wt % to 4 wt % based on the total amount of the curable composition. When the polymerization initiator is included in the ranges, it is possible to obtain excellent reliability due to sufficient curing during exposure or thermal curing and to prevent deterioration of transmittance due to non-reaction initiators, thereby preventing deterioration of optical characteristics of the quantum dots.

Binder Resin

The binder resin may include an acryl-based resin, a cardo-based resin, an epoxy resin, or a combination thereof.

The acryl-based resin may be a copolymer of a first ethylenic unsaturated monomer and a second ethylenic unsaturated monomer that is copolymerizable therewith, and may be a resin including at least one acryl-based repeating unit.

Specific examples of the acryl-based binder resin may be polybenzylmethacrylate, a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, but are not limited thereto, and may be used alone or as a mixture of two or more.

A weight average molecular weight of the acryl-based binder resin may be 5,000 g/mol to 15,000 g/mol. When the acryl-based binder resin has a weight average molecular weight within the ranges, close-contacting properties to a substrate, physical and chemical properties are improved, and a viscosity is appropriate.

The acryl-based resin may have an acid value of 80 mgKOH/g to 130 mgKOH/g. When the acryl-based resin has an acid value within the range, a pixel pattern may have excellent resolution.

The cardo-based resin may be used in a conventional curable resin (or photosensitive resin) composition, and may be, for example, used as disclosed in Korean Patent Application Laid-Open No. 10-2018-0067243, but is not limited thereto.

The cardo-based resin may be, for example prepared by mixing at least two of a fluorene-containing compound such as 9,9-bis(4-oxiranylmethoxyphenyl) fluorene; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, and tetrahydrophthalic anhydride; a glycol compound such as ethylene glycol, propylene glycol, and polyethylene glycol; an alcohol compound such as methanol, ethanol, propanol, n-butanol, cyclohexanol, and benzylalcohol; a solvent-based compound such as propylene glycol methylethylacetate, and N-methylpyrrolidone; a phosphorus compound such as triphenylphosphine; and an amine or ammonium salt compound such as tetramethylammonium chloride, tetraethylammonium bromide, benzyldiethylamine, triethylamine, tributylamine, or benzyltriethylammonium chloride.

A weight average molecular weight of the cardo-based binder resin may be 500 g/mol to 50,000 g/mol, for example 1,000 g/mol to 30,000 g/mol. When the weight average molecular weight of the cardo-based binder resin is within the ranges, a satisfactory pattern may be formed without a residue during a production of a cured layer and without losing a film thickness during development of the solvent type curable composition.

When the binder resin is a cardo-based resin, the developability of the curable composition, particularly the photosensitive resin composition, including the binder resin is improved, and the sensitivity during photocuring is good, so that the fine pattern formation property is improved.

The epoxy resin may be a monomer or oligomer that is capable of being polymerized by heat, and may include a compound having a carbon-carbon unsaturated bond and a carbon-carbon cyclic bond.

The epoxy resin may include, but is not limited to, a bisphenol A-type epoxy resin, a bisphenol F-type epoxy resin, a phenol novolac-type epoxy resin, a cyclic aliphatic epoxy resin, and an aliphatic polyglycidyl ether.

Currently available products thereof may include bisphenyl epoxy resins such as YX4000, YX4000H, YL6121H, YL6640, or YL6677 from Yuka Shell Epoxy Co., Ltd.; cresol novolac-type epoxy resins such as EOCN-102, EOCN-103S, EOCN-104S, EOCN-1020, EOCN-1025, and EOCN-1027 from Nippon Kayaku Co., Ltd. and EPIKOTE 180S75 from Yuka Shell Epoxy Co., Ltd.; bisphenol A epoxy resins such as EPIKOTE 1001, 1002, 1003, 1004, 1007, 1009, 1010, and 828 from Yuka Shell Epoxy Co., Ltd.; bisphenol F-type epoxy resins such as EPIKOTE 807 and 834 from Yuka Shell Epoxy Co., Ltd.; phenol novolac-type epoxy resins such as EPIKOTE 152, 154, and 157H65 from Yuka Shell Epoxy Co., Ltd. and EPPN 201, 202 from Nippon Kayaku Co., Ltd.; other cyclic aliphatic epoxy resins such as CY175, CY177 and CY179 from CIBA-GEIGY A.G, ERL-4234, ERL-4299, ERL-4221, and ERL-4206 from U.C.C, Shodyne 509 from Showa Denko K.K., ARALDITE CY-182, CY-192 and CY-184 from CIBA-GEIGY A.G, Epichron 200 and 400 from Dainippon Ink and Chemicals, Inc., EPIKOTE 871, 872 and EP1032H60 from Yuka Shell Epoxy Co., Ltd., ED-5661 and ED-5662 from Celanese Coatings Co., Ltd.; aliphatic polyglycidylethers such as EPIKOTE 190P and 191P from Yuka Shell Epoxy Co., Ltd., Epolite 100MF from Kyoesha Yushi Co., Ltd., Epiol TMP from Nippon Yushi Co., Ltd., and the like.

For example, when the curable composition according to an embodiment is a solvent-free curable composition, the binder resin may be included in an amount of 0.5 wt % to 10 wt %, for example 1 wt % to 5 wt %, based on the total amount of the curable composition. In this case, heat resistance and chemical resistance of the solvent-free curable composition may be improved, and storage stability of the composition may also be improved.

For example, when the curable composition according to an embodiment is a curable composition including a solvent, the binder resin may be included in an amount of 1 wt % to 30 wt %, for example 3 wt % to 20 wt %, based on the total amount of the curable composition.

In this case, pattern characteristics, heat resistance and chemical resistance may be improved.

Other Additives

For stability and dispersion improvement of the quantum dot, the curable composition according to an embodiment may further include a polymerization inhibitor.

The polymerization inhibitor may include a hydroquinone-based compound, a catechol-based compound, or a combination thereof, but is not necessarily limited thereto. When the curable composition according to an embodiment further includes the hydroquinone-based compound, the catechol-based compound, or the combination thereof, room temperature cross-linking during exposure after coating the curable composition may be prevented.

For example, the hydroquinone-based compound, catechol-based compound or combination thereof may include hydroquinone, methyl hydroquinone, methoxyhydroquinone, t-butyl hydroquinone, 2,5-di-t-butyl hydroquinone, 2,5-bis(1,1-dimethylbutyl) hydroquinone, 2,5-bis(1,1,3,3-tetramethylbutyl) hydroquinone, catechol, t-butyl catechol, 4-methoxyphenol, pyrogallol, 2,6-di-t-butyl-4-methylphenol, 2-naphthol, tris(N-hydroxy-N-nitrosophenylaminato-O, O')aluminium, or a combination thereof, but is not necessarily limited thereto.

The hydroquinone-based compound, catechol-based compound, or combination thereof may be used in the form of a dispersion, and the polymerization inhibitor in the dispersion form may be included in an amount of 0.001 wt % to 3 wt %, for example 0.1 wt % to 2 wt % based on the total amount of the curable composition. When the polymerization inhibitor is included within the above range, the problem of aging at room temperature may be solved, and at the same time, reduction of sensitivity and surface peeling may be prevented.

In addition, the curable composition according to an embodiment may include may further include malonic acid; 3-amino-1,2-propanediol; a silane-based coupling agent; a leveling agent; a fluorine-based surfactant; or a combination thereof in order to improve heat resistance and reliability.

For example, the curable composition according to an embodiment may further include a silane-based coupling agent having a reactive substituent such as a vinyl group, a carboxyl group, a methacryloxy group, an isocyanate group, an epoxy group, and the like in order to improve close-contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-epoxycyclohexyl)ethyltrimethoxysilane, and the like, and these may be used alone or in a mixture of two or more.

The silane-based coupling agent may be included in an amount of 0.01 parts by weight to 10 parts by weight based on 100 parts by weight of the curable composition. When the silane-based coupling agent is included within the range, close-contacting properties, storage capability, and the like are improved.

In addition, the curable composition may further include a surfactant, for example a fluorine-based surfactant as needed in order to improve coating properties and inhibit generation of spots, that is, improve leveling performance.

The fluorine-based surfactant may have a low weight average molecular weight of 4,000 g/mol to 10,000 g/mol, and specifically 6,000 g/mol to 10,000 g/mol. In addition, the fluorine-based surfactant may have a surface tension of 18 mN/m to 23 mN/m (measured in 0.1% polyethylene glycol monomethylether acetate (PGMEA) solution). When the fluorine-based surfactant has a weight average molecular weight and a surface tension within the ranges, leveling performance may be further improved, and excellent characteristics may be provided when slit coating as high speed coating is applied since film defects may be less generated by preventing a spot generation during the high speed coating and suppressing a vapor generation.

Examples of the fluorine-based surfactant may be, BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141® and SURFLON S-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554 and the like from DIC Co., Ltd.

In addition, the curable composition according to an embodiment may include a silicone-based surfactant in addition to the fluorine-based surfactant. Specific examples of the silicone-based surfactant may be TSF400, TSF401, TSF410, TSF4440, and the like of Toshiba Silicone Co., Ltd., but is not limited thereto.

The surfactant may be included in an amount of 0.01 parts by weight to 5 parts by weight, for example 0.1 parts by weight to 2 parts by weight based on 100 parts by weight of the curable composition. When the surfactant is included within the ranges, foreign materials are less produced in a sprayed composition.

In addition, the curable composition according to an embodiment may further include other additives such as an antioxidant, a stabilizer, and the like in a predetermined amount, unless properties are deteriorated.

Solvent

Meanwhile, the curable composition according to an embodiment may further include a solvent.

The solvent may for example include alcohols such as methanol, ethanol, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; hydroxy acetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl ester such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate esters such as ethyl pyruvate, and the like, and in addition, may be N-methylformamide, N,N-dimethyl formamide, N-methylformanilide, N-methylacetamide, N, N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like, but is not limited thereto.

For example, the solvent may be desirably glycol ethers such as ethylene glycol monoethylether, ethylene diglycolmethylethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like; alcohols such as ethanol, and the like, or a combination thereof.

For example, the solvent may be a polar solvent including propylene glycol monomethylether acetate, dipropylene glycol methylether acetate, ethanol, ethylene glycoldimethylether, ethylenediglycolmethylethylether, diethylene glycoldimethylether, 2-butoxyethanol, N-methylpyrrolidine, N-ethylpyrrolidine, propylene carbonate, γ-butyrolactone, or a combination thereof.

The solvent may be included in a balance amount, for example about 30 wt % to about 80 wt %, for example about 35 wt % to about 70 wt % based on the total amount of the solvent type curable composition. When the solvent is within the range, the solvent type curable composition has appropriate viscosity and thus may have excellent coating property when coated in a large area through spin-coating and slit-coating.

Another embodiment provides a cured layer manufactured using the aforementioned curable composition and a display device including the cured layer.

One of methods of manufacturing the cured layer may include coating the curable composition on a substrate using an ink-jet spraying method to form a pattern (S1); and curing the pattern (S2).

(S1) Formation of Pattern

The curable composition may desirably be coated to be about 0.5 μm to about 20 μm on a substrate in an ink-jet spraying method. The ink-jet spraying method may form a pattern by spraying a single color per each nozzle and thus repeating the spraying as many times as the needed number of colors, but the pattern may be formed by simultaneously spraying the needed number of colors through each ink-jet nozzle in order to reduce processes.

(S2) Curing

The obtained pattern is cured to obtain a pixel. Herein, the curing method may be thermal curing or photocuring process. The thermal curing process may be performed at greater than or equal to about 100° C., desirably, in a range of about 100° C. to about 300° C., and more desirably, in a range of about 160° C. to about 250° C. The photocuring process may include irradiating an actinic ray such as a UV ray of about 190 nm to about 450 nm, for example about 200 nm to about 500 nm. The irradiating is performed by using a light source such as a mercury lamp with a low pressure, a high pressure, or an ultrahigh pressure, a metal halide lamp, an argon gas laser, and the like. An X ray, an electron beam, and the like may be also used as needed.

The other method of manufacturing the cured layer may include manufacturing a cured layer using the aforementioned curable composition by a lithographic method as follows.

(1) Coating and Film Formation

The curable composition is coated to have a desired thickness, for example, a thickness ranging from about 2 μm to about 10 μm, on a substrate which undergoes a predetermined pretreatment, using a spin or slit coating method, a roll coating method, a screen-printing method, an applicator method, and the like. Then, the coated substrate is heated at a temperature of about 70° C. to about 90° C. for about 1 minute to about 10 minutes to remove a solvent and to form a film.

(2) Exposure

The resultant film is irradiated by an actinic ray such as a UV ray of about 190 nm to about 450 nm, for example about 200 nm to about 500 nm after putting a mask with a predetermined shape to form a desired pattern. The irradiating is performed by using a light source such as a mercury lamp with a low pressure, a high pressure, or an ultrahigh pressure, a metal halide lamp, an argon gas laser, and the like. An X ray, an electron beam, and the like may be also used as needed.

Exposure process uses, for example, a light dose of 500 mJ/cm$^2$ or less (with a 365 nm sensor) when a high pressure mercury lamp is used. However, the light dose may vary depending on types of each component of the curable composition, its combination ratio, and a dry film thickness.

(3) Development

After the exposure process, an alkali aqueous solution is used to develop the exposed film by dissolving and removing an unnecessary part except the exposed part, forming an image pattern. In other words, when the alkali developing solution is used for the development, a non-exposed region is dissolved, and an image color filter pattern is formed.

(4) Post-Treatment

The developed image pattern may be heated again or irradiated by an actinic ray and the like for curing, in order to accomplish excellent quality in terms of heat resistance, light resistance, close-contacting properties, crack-resistance, chemical resistance, high strength, storage stability, and the like.

Hereinafter, the present invention is illustrated in more detail with reference to examples. These examples, however, are not in any sense to be interpreted as limiting the scope of the invention.

Preparation of Surface-Modified Quantum Dots

Preparation Example

After putting a magnetic bar in a 3-necked round-bottomed flask, green quantum dot dispersion solution (InP/ZnSe/ZnS, Hansol Chemical; quantum dot solid content of 23 wt %) was put therein. The compound represented by Chemical Formula Q (a ligand) was added thereto and then, stirred at 80° C. under a nitrogen atmosphere. When a reaction was completed, after decreasing the temperature down to room temperature (23° C.), the quantum dot reaction solution was added to cyclohexane, catching precipitates. The precipitates were separated from the cyclohexane through centrifugation and then, sufficiently dried in a vacuum oven for one day, obtaining surface-modified quantum dots.

(*Synthesis of Compound represented by Chemical Formula Q: 100 g of PH-4 (Hannong Chemical Inc.) was put in a 2 neck round-bottomed flask and then, sufficiently dissolved in 300 mL of THF. 15.4 g of NaOH and 100 mL of water were injected thereinto at 0° C. and then, sufficiently dissolved, until a clear solution was obtained, A solution obtained by dissolving 73 g of para-toluene sulfonic chloride in 100 mL of THF was slowly injected thereinto at 0° C. The injection proceeded for 1 hour, and the obtained mixture was stirred at room temperature for 12 hours. When a reaction was completed, an excessive amount of methylene chloride was added thereto and then, stirred, and a NaHCO$_3$ saturated solution was added thereto, which was followed by extraction, titration, and water removal. After removing the solvent, the residue was dried in a dry oven for 24 hours. 50 g of the dried product was put in a 2 necked round-bottomed flask and sufficiently stirred in 300 mL of ethanol. Subsequently, 27 g of thiourea was added thereto and dispersed therein and then, refluxed at 80° C. for 12 hours. Then, an aqueous solution prepared by dissolving 4.4 g of NaOH in 20 mL of water was injected thereinto, while further stirred for 5 hours, an excessive amount of methylene chloride was added thereto, and then, a hydrochloric acid aqueous solution was added thereto, which was sequentially followed by extraction, titration, water removal, and solvent removal. The obtained product was dried in a vacuum oven for 24 hours, obtaining a compound represented by Chemical Formula Q.)

[Chemical Formula Q]

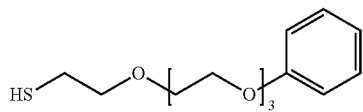

(Preparation of Curable Compositions)

Based on each of the following components, curable compositions according to Examples 1 to 15 and Comparative Examples 1 to 5 were prepared.

(A) Quantum Dots

Surface-modified green quantum dots prepared from the above preparation example (B) Polymerizable Compound (b-1) a compound represented by Chemical Formula 1-1 (viscosity: 8 cPs, vapor pressure: 3×10$^{-4}$ torr)

[Chemical Formula 1-1]

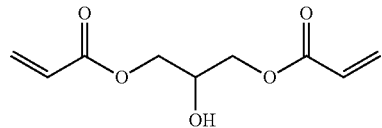

(b-2) a compound represented by Chemical Formula 1-2 (viscosity: 12 cPs, vapor pressure: 7.3×10$^{-4}$ torr)

[Chemical Formula 1-2]

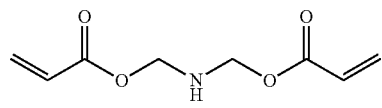

(b-3) a compound represented by Chemical Formula 1-3 (viscosity: 9.8 cPs, vapor pressure: 9.1×10$^{-4}$ torr)

[Chemical Formula 1-3]

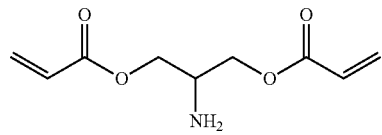

(b-4) a compound represented by Chemical Formula 2-1 (viscosity: 3.8 cPs, vapor pressure: $4.9 \times 10^{-2}$ torr)

[Chemical Formula 2-1]

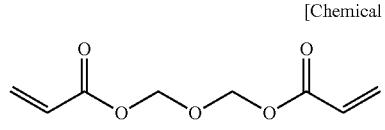

(b-5) a compound represented by Chemical Formula 2-2 (viscosity: 4.4 cPs, vapor pressure: $1 \times 10^{-3}$ torr)

[Chemical Formula 2-2]

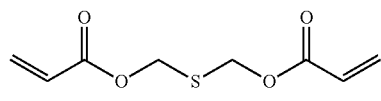

(b-6) a compound represented by Chemical Formula 2-3 (viscosity: 5.8 cPs, vapor pressure: $5 \times 10^{-3}$ torr)

[Chemical Formula 2-2]

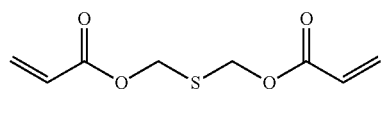

(b-7) a compound represented by Chemical Formula 2-4 (viscosity: 4.2 cPs, vapor pressure: $1 \times 10^{-2}$ torr)

[Chemical Formula 2-4]

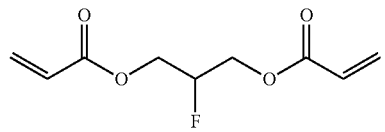

(b-8) a compound represented by Chemical Formula 2-5 (viscosity: 6 cPs, vapor pressure: $4 \times 10^{-3}$ torr)

[Chemical Formula 2-5]

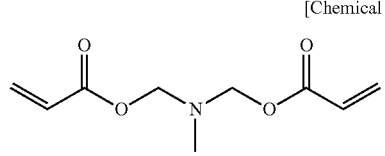

(b-9) a compound represented by Chemical Formula C-1 (viscosity: 6.2 cPs, vapor pressure: $1 \times 10^{-3}$ torr)

[Chemical Formula C-1]

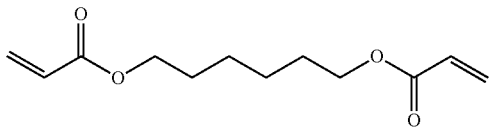

(C) Photopolymerization Initiator
  OXE01 (BASF)
(D) Light Diffusing Agent
  Titanium dioxide dispersion (SDT89, Iridos Co., Ltd., 50% of solid content)
(E) Polymerization Inhibitor
  Methylhydroquinone (TOKYO CHEMICAL Corporation)

Examples 1 to 15

Specifically, the surface-modified quantum dots according to the preparation example were mixed with a first polymerizable compound in an equal weight ratio and then, stirred for 12 hours. A second polymerizable compound and a polymerization inhibitor were added thereto and then, stirred for 5 minutes. Subsequently, a photoinitiator (TPO-L, PolyNetron) was added thereto, and then, a light diffusing agent was added thereto.

(Taking Example 1 as an example, 40 g of the surface-modified green quantum dots were mixed with 40 g of a compound represented by Chemical Formula 1-2 as the first polymerizable compound and then, stirred to prepare quantum dot dispersion, 12.5 g of a compound represented by Chemical Formula 2-1 as the second polymerizable compound and 0.5 g of a polymerization inhibitor were added thereto and then, stirred for 5 minutes, and subsequently, 3 g of a photoinitiator, and 4 g of a light diffusing agent were added thereto and then, stirred, preparing a curable composition.) Specific compositions are shown in Table 1.

TABLE 1

| | | Polymerizable compound | | | | | | | | | |
| | | First polymerizable compound | | | Second polymerizable compound | | | | | | Light |
| | Quantum dot | b-1 | b-2 | b-3 | b-4 | b-5 | b-6 | b-7 | b-8 | Polymerization inhibitor | Photoinitiator | diffusing agent |
|---|---|---|---|---|---|---|---|---|---|---|---|---|
| Ex. 1 | 40 | — | 40 | — | 12.5 | — | — | — | — | 0.5 | 3 | 4 |
| Ex. 2 | 40 | — | 40 | — | — | 12.5 | — | — | — | 0.5 | 3 | 4 |
| Ex. 3 | 40 | — | 40 | — | — | — | 12.5 | — | — | 0.5 | 3 | 4 |

TABLE 1-continued

| | Quantum dot | First polymerizable compound | | | Second polymerizable compound | | | | | Polymerization inhibitor | Photoinitiator compound | Light diffusing agent |
|---|---|---|---|---|---|---|---|---|---|---|---|---|
| | | b-1 | b-2 | b-3 | b-4 | b-5 | b-6 | b-7 | b-8 | | | |
| Ex. 4 | 40 | — | 40 | — | — | — | — | 12.5 | — | 0.5 | 3 | 4 |
| Ex. 5 | 40 | — | 40 | — | — | — | — | — | 12.5 | 0.5 | 3 | 4 |
| Ex. 6 | 40 | 40 | — | — | 12.5 | — | — | — | — | 0.5 | 3 | 4 |
| Ex. 7 | 40 | 40 | — | — | — | 12.5 | — | — | — | 0.5 | 3 | 4 |
| Ex. 8 | 40 | 40 | — | — | — | — | 12.5 | — | — | 0.5 | 3 | 4 |
| Ex. 9 | 40 | 40 | — | — | — | — | — | 12.5 | — | 0.5 | 3 | 4 |
| Ex. 10 | 40 | 40 | — | — | — | — | — | — | 12.5 | 0.5 | 3 | 4 |
| Ex. 11 | 40 | — | — | 40 | 12.5 | — | — | — | — | 0.5 | 3 | 4 |
| Ex. 12 | 40 | — | — | 40 | — | 12.5 | — | — | — | 0.5 | 3 | 4 |
| Ex. 13 | 40 | — | — | 40 | — | — | 12.5 | — | — | 0.5 | 3 | 4 |
| Ex. 14 | 40 | — | — | 40 | — | — | — | 12.5 | — | 0.5 | 3 | 4 |
| Ex. 15 | 40 | — | — | 40 | — | — | — | — | 12.5 | 0.5 | 3 | 4 |

(unit: wt %)

Comparative Example 1

40 g of the surface-modified green quantum dots and 40 g of a polymerizable compound represented by Chemical Formula C-1 were mixed and stirred to prepare quantum dot dispersion, 12.5 g of the polymerizable compound represented by Chemical Formula C-1 and 0.5 g of a polymerization inhibitor were added thereto and stirred for 5 minutes, and subsequently, 3 g of a photoinitiator and 4 g of a light diffusing agent were added thereto and then, stirred, preparing a curable composition.

Comparative Example 2

A curable composition was prepared according to the same method as Comparative Example 1 except that the polymerizable compound represented by Chemical Formula 2-1 was used instead of the polymerizable compound represented by Chemical Formula C-1.

Comparative Example 3

A curable composition was prepared according to the same method as Comparative Example 1 except that the polymerizable compound represented by Chemical Formula 1-2 was used instead of the polymerizable compound represented by Chemical Formula C-1.

Comparative Example 4

A curable composition was prepared according to the same method as Example 1 except that the polymerizable compound represented by Chemical Formula C-1 was used instead of first polymerizable compound (the compound represented by Chemical Formula 1-2).

Comparative Example 5

A curable composition was prepared according to the same method as Example 1 except that the polymerizable compound represented by Chemical Formula C-1 was used instead of the first polymerizable compound (the compound represented by Chemical Formula 1-2), and the polymerizable compound represented by Chemical Formula 1-2 was used instead of the second polymerizable compound (the compound represented by Chemical Formula 2-1).

Evaluation 1: Evaluation of Ink Viscosity and Jetting Properties

Each curable composition according to Examples 1 to 15 and Comparative Examples 1 to 5 was measured with respect to initial viscosity at 25° C. by using a viscometer (RV-2 spins, 23 rpm, DV-II, Brookfield Engineering Laboratories, Inc.), and the results are shown in Table 2, and 15 days later, viscosity of the compositions was measured again, wherein when the viscosity after 15 days was increased by less than 0.5 cps, compared with the initial viscosity, it was evaluated as "good," while when the viscosity after 15 days was increased by 0.5 cps or higher, it was evaluated as "inferior," and the results are shown in Table 2. As the viscosity exhibited no larger change over time, ink-jetting properties were considered to be more excellent, and accordingly, all the examples evaluated as 'good' in Table 2 were expected to have excellent ink-jetting properties.

TABLE 2

| | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Initial viscosity (cPs) | 23.5 | 24.6 | 24.9 | 24.4 | 25.8 | 23.7 | 24.6 | 25.4 | 24.3 | 25.9 |

TABLE 2-continued

| Ink-jetting properties | good | good | good | good | good | good | good | good | good | good |

| | Ex. 11 | Ex. 12 | Ex. 13 | Ex. 14 | Ex. 15 | Ex. 1 Comp. | Comp. Ex. 2 | Comp. Ex. 3 | Comp. Ex. 4 | Comp. Ex. 5 |
| --- | --- | --- | --- | --- | --- | --- | --- | --- | --- | --- |
| Initial viscosity (cPs) | 22.8 | 23.2 | 24.1 | 23.1 | 24.5 | 26.2 | 23.4 | 40.1 | 29.5 | 31.3 |
| Ink-jetting properties | good | good | good | good | good | inferior | inferior | inferior | inferior | inferior |

Evaluation 2: Evaluation of Volatility

Figure 2:
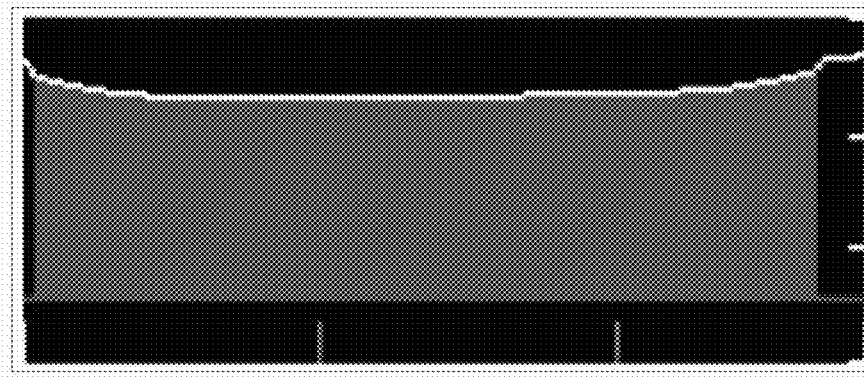
FIG. 2 is a cross-sectional photograph of a film after 1 hour has elapsed after ink-jetting a pixel with a curable composition according to Comparative Example 1.
Figure 3:
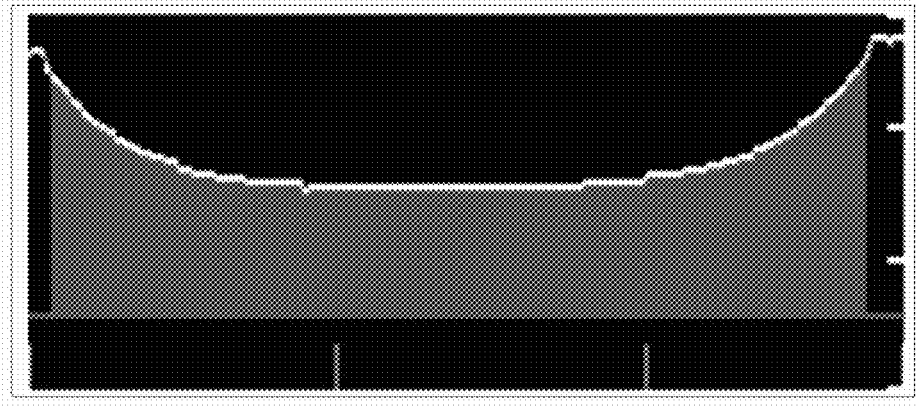
FIG. 3 is a cross-sectional photograph of a film after 1 hour has elapsed after ink-jetting a pixel with a curable composition according to Comparative Example 2.
Figure 4:
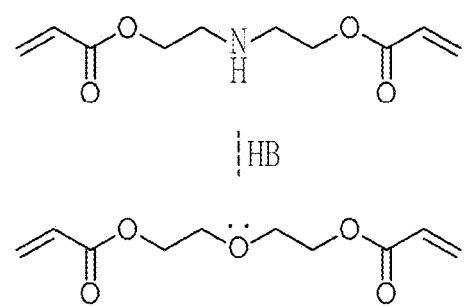
FIG. 4 is a schematic view showing that hydrogen bonding occurs between the first polymerizable compound and the second polymerizable compound of the present invention.

Each curable composition according to Examples 1 to 15 and Comparative Examples 1 to 5 was ink-jetted in a pixel having partition walls, and after one hour, a single film formed thereof was measured with respect to a thickness reduction rate by using a 3D optical microscope (VK-9710 color 3D laser microscope, KEYENCE Corp.), and the results are shown in Table 3 and FIGS. 1 to 3.

TABLE 3

| Ex. 1 | Ex. 2 | Ex. 3 | Ex. 4 | Ex. 5 | Ex. 6 | Ex. 7 | Ex. 8 | Ex. 9 | Ex. 10 |
| --- | --- | --- | --- | --- | --- | --- | --- | --- | --- |
| 5 | 6 | 5 | 5 | 4 | 5 | 5 | 7 | 5 | 4 |

| Ex. 11 | Ex. 12 | Ex. 13 | Ex. 14 | Ex. 15 | Comp. Ex. 1 | Comp. Ex. 2 | Comp. Ex. 3 | Comp. Ex. 4 | Comp. Ex. 5 |
| --- | --- | --- | --- | --- | --- | --- | --- | --- | --- |
| 6 | 5 | 4 | 4 | 5 | 15 | 30 | 31 | 21 | 22 |

(unit: %)

Referring to Tables 2 and 3, a hydrogen bond between different polymerizable compounds used in a curable composition was used to simultaneously improve ink-jetting properties and volatility of the composition.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A curable composition, comprising a quantum dot and a polymerizable compound, wherein the polymerizable compound comprises a first polymerizable compound serving as a hydrogen bond donor and a second polymerizable compound serving as a hydrogen bond acceptor, and the first polymerizable compound and second polymerizable compound each independently comprises a (meth) acrylate group at at least one terminal end, and wherein the second polymerizable compound is represented by Chemical Formula 2:

[Chemical Formula 2]

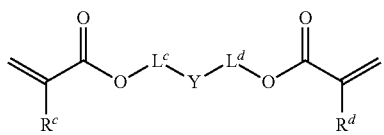

wherein, in Chemical Formula 2, $R^c$ and $R^d$ are each independently a hydrogen atom or a substituted or unsubstituted C1 to C10 alkyl group, $L^c$ and $L^d$ are each independently a single bond, a substituted or unsubstituted C1 to C20 alkylene group, or a substituted or unsubstituted C6 to C20 arylene group, and Y is a sulfur atom, *—C(=O)—*, a C1 to C10 alkylene group substituted with a fluorine atom or *—$NR^e$ ($R^e$ is a C1 to C10 alkyl group or a C6 to C20 aryl group)-*.

2. The curable composition of claim 1, wherein the first polymerizable compound is represented by Chemical Formula 1:

[Chemical Formula 1]

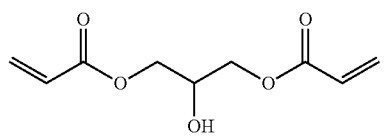

wherein, in Chemical Formula 1, $R^a$ and $R^b$ are each independently a hydrogen atom or a substituted or unsubstituted C1 to C10 alkyl group, $L^a$ and $L^b$ are each independently a single bond, a substituted or unsubstituted C1 to C20 alkylene group, or a substituted or unsubstituted C6 to C20 arylene group, and X is a C1 to C10 alkylene group substituted with a hydroxyl group, a C1 to C10 alkylene group substituted with an amino group, or *—NH—*.

3. The curable composition of claim 1, wherein the first polymerizable compound has a viscosity greater than 6.2 cps and a vapor pressure less than $1\times10^{-3}$ torr at 25° C.

4. The curable composition of claim 1, wherein the first polymerizable compound represented by any one of Chemical Formula 1-1 to Chemical Formula 1-3:

[Chemical Formula 1-1]

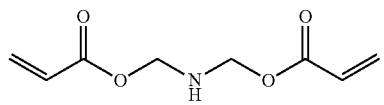

[Chemical Formula 1-2]

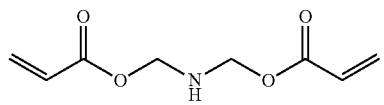

[Chemical Formula 1-3]

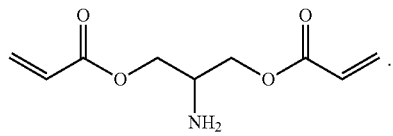

5. The curable composition of claim 1, wherein the second polymerizable compound has a viscosity of less than or equal to 6.2 cps and a vapor pressure of greater than or equal to $1\times10^{-3}$ torr at 25° C.

6. The curable composition of claim 1, wherein the second polymerizable compound is represented by any one of Chemical Formula 2-2 to Chemical Formula 2-5:

[Chemical Formula 2-2]

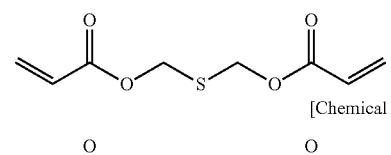

[Chemical Formula 2-3]

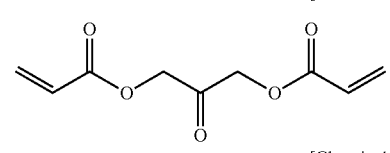

[Chemical Formula 2-4]

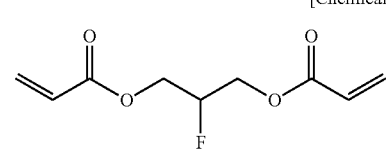

[Chemical Formula 2-5]

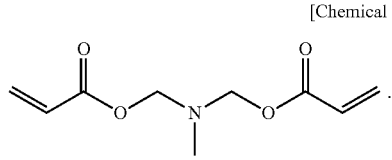

7. The curable composition of claim 1, wherein the curable composition is a solvent-free curable composition.

8. The curable composition of claim 7, wherein
the solvent-free curable composition comprises
5 wt % to 60 wt % of the quantum dot; and
40 wt % to 95 wt % of the polymerizable compound based on the total amount of the solvent-free curable composition.

9. The curable composition of claim 1, wherein the curable composition further comprises a polymerization initiator, a light diffusing agent, a binder resin, or a combination thereof.

10. The curable composition of claim 9, wherein the light diffusing agent comprises barium sulfate, calcium carbonate, titanium dioxide, zirconia, or a combination thereof.

11. The curable composition of claim 1, wherein the curable composition further comprises a solvent.

12. The curable composition of claim 11, wherein the curable composition comprises 1 wt % to 40 wt % of the quantum dot; 1 wt % to 20 wt % of the polymerizable compound; and 40 wt % to 80 wt % of the solvent based on the total amount of the curable composition.

13. The curable composition of claim 1, wherein the curable composition further comprises a polymerization inhibitor; malonic acid; 3-amino-1,2-propanediol; a silane-based coupling agent; a leveling agent; a fluorine-based surfactant; or a combination thereof.

14. A cured layer manufactured using the curable composition of claim 1.

15. A color filter comprising the cured layer of claim 14.

* * * * *

UNITED STATES PATENT AND TRADEMARK OFFICE
CERTIFICATE OF CORRECTION

PATENT NO. : 12,365,833 B2  
APPLICATION NO. : 18/011485  
DATED : July 22, 2025  
INVENTOR(S) : Jonggi Kim et al.

Page 1 of 1

It is certified that error appears in the above-identified patent and that said Letters Patent is hereby corrected as shown below:

In the Claims

In Column 31, Lines 28-33, in Claim 2, Chemical Formula 1, delete "

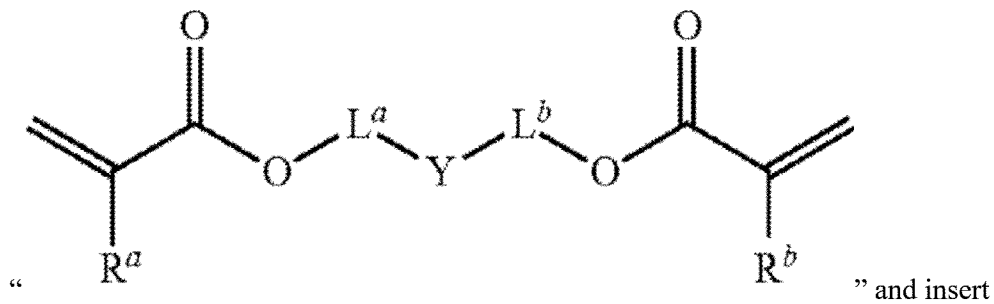

" and insert

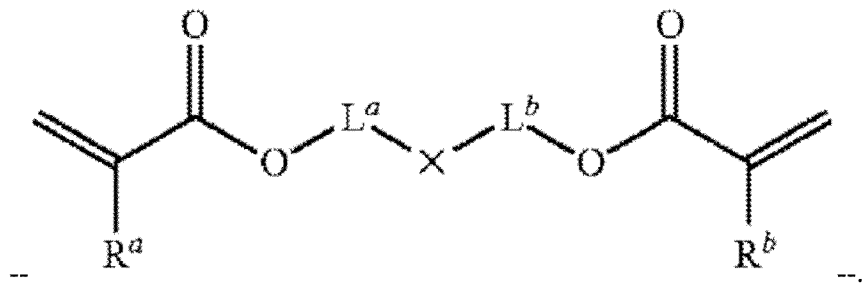

--.

Signed and Sealed this  
Second Day of December, 2025

John A. Squires  
*Director of the United States Patent and Trademark Office*